United States Patent
Shoulders et al.

(10) Patent No.: US 6,212,479 B1
(45) Date of Patent: Apr. 3, 2001

(54) SUPER HETERODYNED POWER DETECTOR WITH ENHANCED LINEARITY FOR USE IN POWER LEVELING LOOPS

(75) Inventors: Robert E. Shoulders; Michal Krombholz, both of Santa Rosa, CA (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/126,910

(22) Filed: Jul. 31, 1998

(51) Int. Cl.[7] .................................................. H04B 17/00
(52) U.S. Cl. ........................ 702/104; 455/67.4; 455/226.1
(58) Field of Search ............................ 702/104; 324/106; 455/115, 126, 127, 226.1; 330/282, 129, 135; 342/202

(56) References Cited

U.S. PATENT DOCUMENTS 3,611,130 * 10/1971 Larsen .................................. 324/106
5,835,850 * 11/1998 Kumar ................................ 455/67.4

* cited by examiner

Primary Examiner—Kamini Shah

(57) ABSTRACT

The present invention provides an improved power detector and more particularly a power leveling loop with a super-heterodyned adjustable gain power detector. In one preferred embodiment, the adjustable gain power leveling detector receives an output signal from a directional coupler. According to the present invention, the leveling detector includes means for producing a signal whose amplitude is proportional to the amplitude of the output signal from the directional coupler and whose frequency is equal to a fixed intermodulation IF frequency, a power detector for providing a stable DC output voltage signal for an input of a single power at the IF frequency; and a leveling loop for maintaining the power detector DC voltage signal substantially constant.

11 Claims, 3 Drawing Sheets

New Power Leveling Detector In A Heterodyned Stimulus Response Measurement System

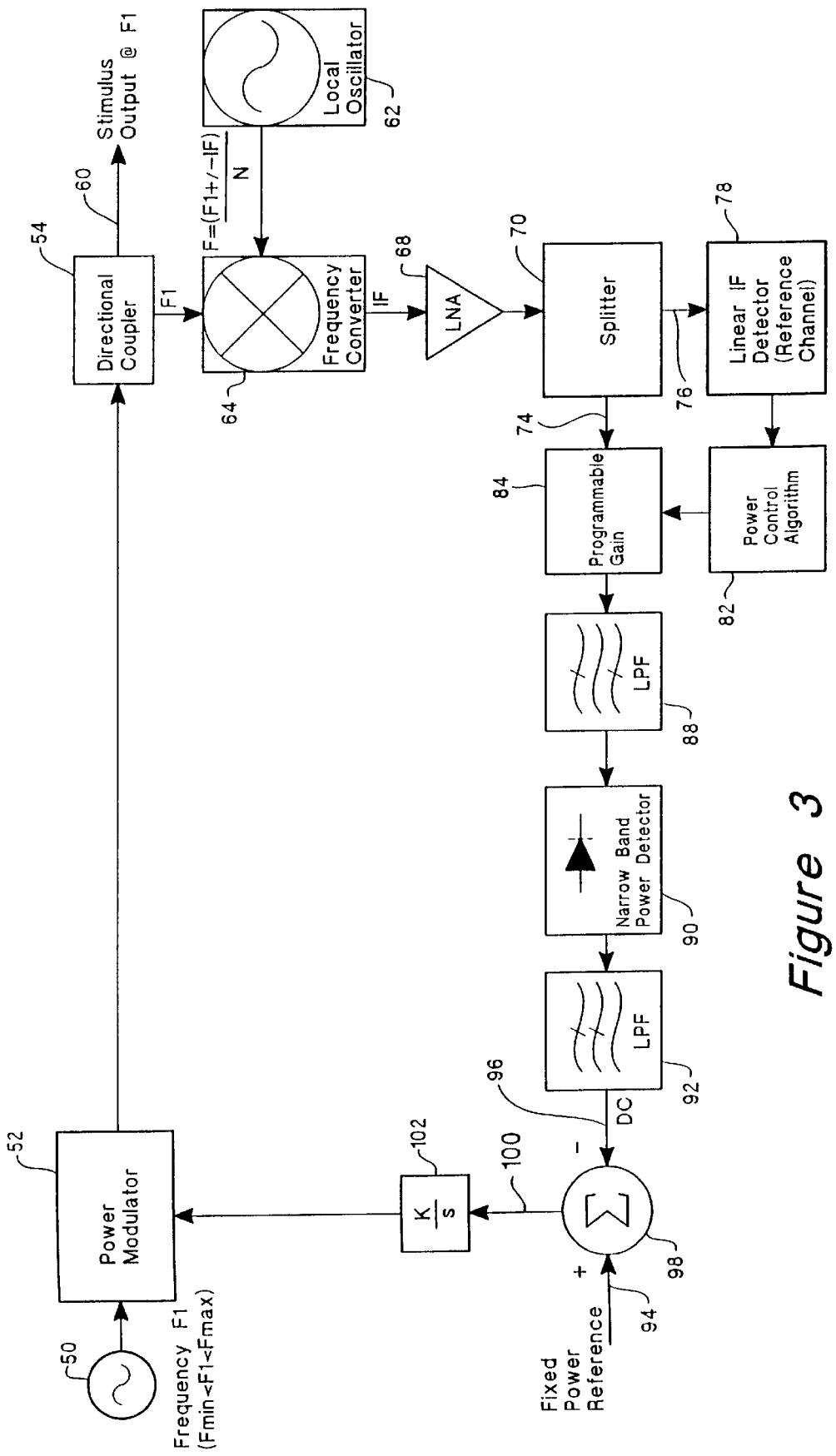

SUPER HETERODYNED POWER DETECTOR WITH ENHANCED LINEARITY FOR USE IN POWER LEVELING LOOPS

BACKGROUND OF THE INVENTION

The present invention relates to a power detector and more particularly to a super heterodyned power detector with enhanced linearity for use in power leveling loops.

FIG. 1 shows a typical power leveling loop in which a source 10 provides a frequency F1 to power modulator 12. Modulator 12 provides an input to directional coupler 14, which in turn provides an output F1 on line 16 and an input F1 of broad band power detector 20. This design uses power detector 20 to convert the coupled signal to DC, which is then filtered through LPF 22 and compared to a power reference voltage 26 in difference amplifier 24. The difference signal 28 drives the loop integrator 29 which in turn drives the power modulator 12, so that the power is automatically adjusted until the detector voltage equals the reference voltage. This approach has several limitations:

1. The directional detector must operate at the measurement frequency. This degrades the performance in several ways.
   a. The detector performance is not constant with frequency. Therefore, when the power is adjusted by changing the reference setting, the output power change is not constant with frequency.
   b. The detector must have enough bandwidth to operate at all output frequencies. For microwave systems, this can mean more than 10 gigahertz of bandwidth. This broad bandwidth limits the sensitivity of the leveling loop, since the noise power is proportional to bandwidth. As a result, the power adjustment range of the loop is reduced. In addition, since the detector responds to all frequencies within the bandwidth, output power at frequencies other than the desired output frequency will effect the power setting.
   c. The requirement for full frequency coverage can also result in added system complexity, since there may be no single detector with adequate bandwidth to cover the entire frequency range. If this is the case, some sort of frequency multiplexing with multiple detectors would become necessary.
2. When the power is varied, the variation appears directly at the detector. Therefore, the power control accuracy is degraded by nonideality of the detector device.
3. The directional coupler reduces the maximum power available to the test port.

In view of the foregoing, it would be desirable to provide an improved power detector.

SUMMARY OF THE INVENTION

It is an object of the present invention to provide an improved power detector and more particularly a power leveling loop with a superheterodyned adjustable gain power detector.

In one preferred embodiment, the adjustable gain power leveling detector receives an output signal from a directional coupler. According to the present invention, the leveling detector includes means for producing a signal whose amplitude is proportional to the amplitude of the output signal from the directional coupler and whose frequency is equal to a fixed intermodulation IF frequency, a power detector for providing a stable DC output voltage signal for an input of a single power at the IF frequency; and a leveling loop for maintaining the power detector DC voltage signal substantially constant for output powers in the power adjustment range.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 3 shows a block diagram of a power leveling detector in a heterodyned stimulus response measurement system according to the present invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention allows accurate, frequency independent control of port power over a wider range of power settings than possible with existing power leveling designs. It allows a power control over a broad frequency range using a simple power detection device that operates at a single frequency. The power detection occurs at a low IF frequency, reducing the cost and complexity of the detector.

The detector bandwidth is determined by the requirements of the leveling loop alone, and is much smaller than the required in the past. This results an increase in the power control range. In one embodiment, the present invention provides greater than 20 dB of tuning range at 110 GHz, compared to 5 dB for most comparable systems.

The present invention takes advantage of the existing signal separation and down conversion necessary for the stimulus response measurement, and therefore adds no microwave hardware to the system, saving cost, complexity, and avoiding the reduction of available port power that would otherwise occur.

Figure 1:
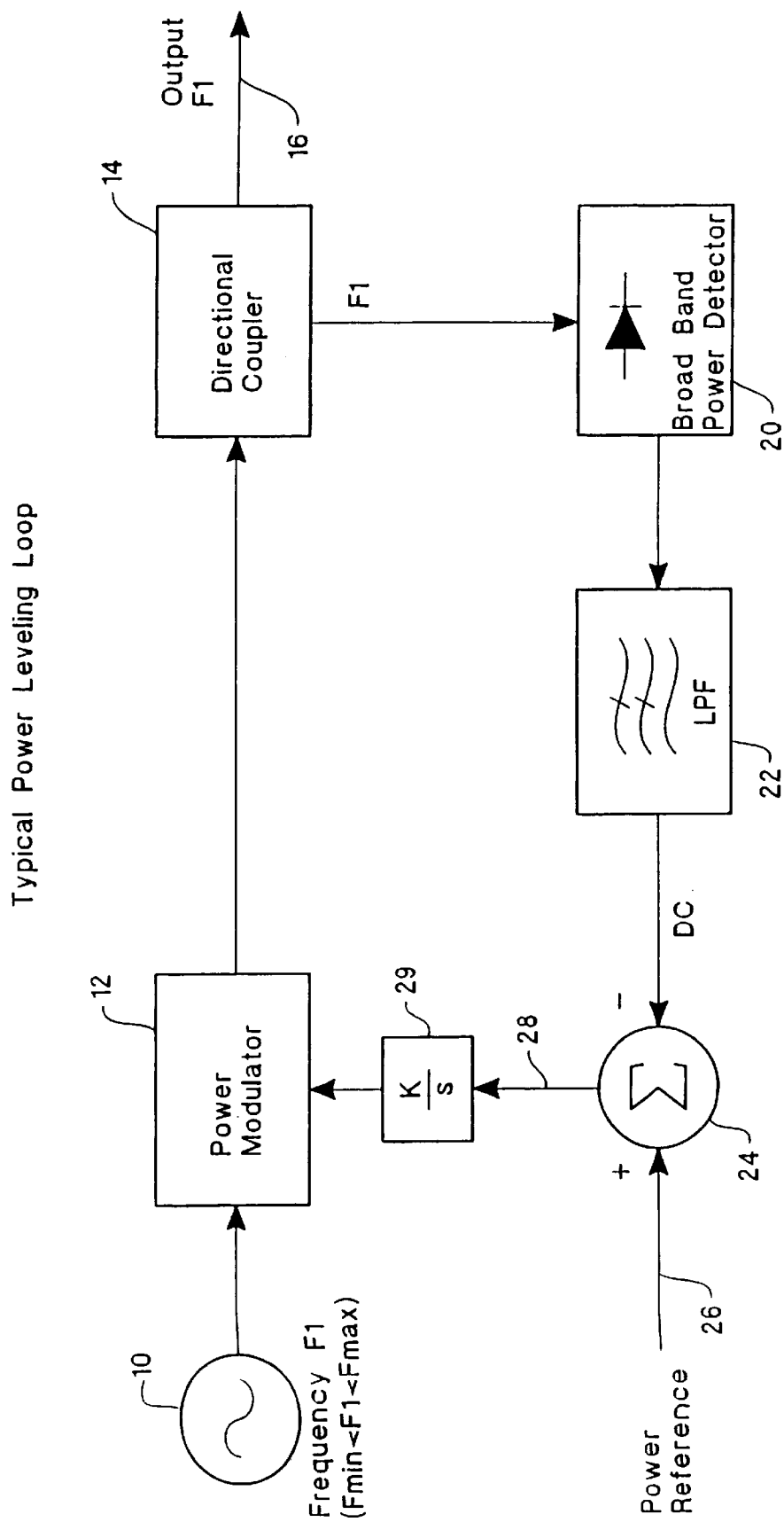
FIG. 1 shows a block diagram of a typical power leveling loop for a power detector.
Figure 2:
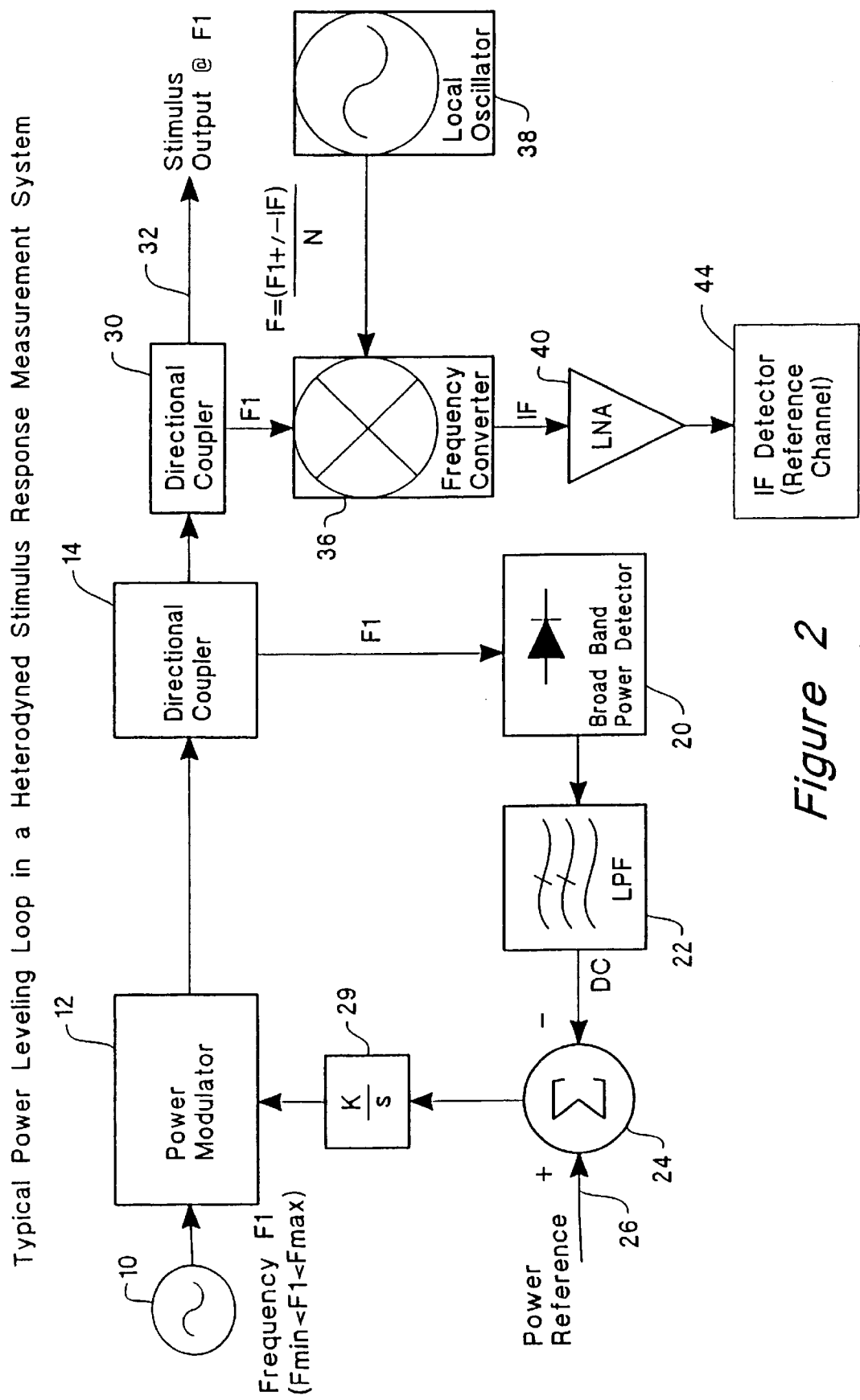
FIG. 2 shows a block diagram of a typical power leveling loop in a heterodyned stimulus response measurement system.

FIG. 2 is simplified block diagram of the stimulus system in stimulus response measurement system employing a typical leveling loop. The system in FIG. 2 includes source 10, power modulator 12, directional coupler 14, power detector 20, LPF 22, power reference 26 and difference amplifier 24 analogous to FIG. 1. The system in FIG. 2 includes second directional coupler 30, frequency convertor 36, local oscillator 38, low noise amplifier (LNA) 40 and IF detector (reference channel) 44. Note the requirement for two couplers in FIG. 2, one for the leveling loop and one for the reference channel.

FIG. 3 shows the new detector, integrated into the same stimulus system, eliminating one directional coupler of FIG. 2.

In order to adjust power, the present invention utilizes calibrated programmable gain stages prior to the detector to predictably vary the gain. The detector input power is held constant. As a result, the effects of detector nonideality are virtually eliminated. Periodic internal calibrations ensure the continued accuracy of the gain stage steps.

Referring to FIG. 3, the leveling detector according to the present invention includes a local oscillator 62, a frequency converting device 64, a low noise amplifier (LNA) 68, a frequency splitter 70, a programmable gain amplifier 84, a band pass filter 88, a narrow band power detector 90, a low pass filter 92, a linear IF detector 78, and a power control algorithm 82.

The function of local oscillator 62 and frequency conversion device 64 is to produce a signal whose amplitude is proportional to the amplitude of the signal output from directional coupler 54 and whose frequency is equal to a fixed intermodulation (IF) frequency. The proportionality constant need not be the same for every input frequency, but at any given frequency it must be constant for all input powers. In one preferred implementation, several different fundamental and harmonic mixers are used for this function.

The purpose of the low noise amplifier 68 is to amplify the IF frequency adequately to compensate for losses in the splitter 70 while injecting as little noise as possible.

The splitter 70 provides two output signals 74, 76, each proportional to the input signal. The programmable gain amplifier 84 amplifies the signal 74 from the splitter 70 by a programmable gain factor, which is implemented by cascading solid state step attenuators with wide dynamic range amplifiers (not shown). The power setting resolution is determined by the smallest programmable gain step size. In order to maximize power control range, the maximum gain of this amplifier should be high, and care must be taken in layout to ensure that the amplifier will be stable and distortion free at all gain settings. In one implementation, the gain is adjustable from 0 to 66.5 dB in 0.5 dB steps.

The purpose of the power detector 90 is to provide a stable or substantially constant DC output voltage for an input of a single power at the IF frequency. Neither the detector 90 frequency response nor its linearity affect the performance of the leveling loop. The low pass filter 92 removes residual from the DC output of the detector 90. The DC output 96 is input to difference amplifier 98 which also receives a fixed power reference 94 to form difference signal 100, which drives loop integrator 102, the output of which is input to power modulator 52. Power modulator 52 also receives Fl from source 50 to provide an input to directional coupler 54, which provides the input F1 to frequency convertor 64 and stimulus output F1 at 60.

The IF detector 78 is used in calibration only. Detector 78 needs to be linear over a wide range of single levels. Detector 78 operates at the IF frequency only, and is not constrained by the dynamic requirements of the leveling loop, such as delay and minimum bandwidth (see below). In one implementation, an HP 8510C is used as the IF detector.

The Power Control Algorithm 82 uses information collected from the calibration and power setting information from the user to set the gain to the appropriate level to give the desired power at the RF setting.

The detector is intended to be used in a leveling loop with the power reference 94 to the difference amplifier 98 fixed. Under this condition, the leveling loop will always operate with a fixed (substantially constant) power level at the power detector 90. Due to the action of the leveling loop the output signal power of the programmable gain amplifier 84 will always be the same. The effect of changing the gain of the programmable amplifier 84 is, therefore, to change the signal power at the input of the amplifier 84. Since the signal power at the input is linearly related to the system output power 60 at Fl, the output power, at any frequency, will change one for one with gain changes at the IF frequency. Since the detector always operates at the same power level, its nonlinearities have no effect on the power accuracy.

By measuring the effect on the IF signal level of the various gain settings of the amplifier, a table can be constructed of power change at the system output verus gain setting. These measurements may be made accurately to very low signal levels since the IF detector 78 may utilize very narrow bandwidths when making the measurements, since it in no way effects the leveling loop. The absolute power at a given gain setting is also measured using an accurate power sensor at the system output in a separate calibration. By combining the information from these two calibrations, the output power can be set accurately to any level at any frequency, limited primarily by constraints of the system apart form the detector, including the modulation range of the modulator, the maximum source power, and the frequency range supported by the source, the modulator, the directional coupler and the frequency converter.

The maximum bandwidth of the various components of the system is determined by the stability requirements of the leveling loop. All components of the detector following the frequency converter and prior to the detection device must have a bandwidth equal to or greater than twice the minimum bandwidth centered on the IF frequency. The low pass filter bandwidth must be equal to or greater than the minimum bandwidth. The frequency converter RF bandwidth must cover all frequencies to be leveled, and must be greater than twice the minimum bandwidth. In one implementation, the minimum bandwidth is 500 kHz. The RF bandwidth that would be required in one implementation using broad band power detectors would be 50 GHz. Thus the new detector has an effective processing gain of $10*\log(100000)=50$ dB/

The lowest power level for which the detector can provide a stable voltage will be set by the bandwidth and noise figure of the detector. The bandwidth is described above. The noise figure is determined by the coupling factor and loss of the directional coupler, the noise figure of the frequency conversion device, and noise injection by the local oscillator, and the noise figure of the LNA. In one implementation, the noise figure of the detector is approximately 60 dB at 110 GHz. This results in a detector noise level given by $-174+10*\log(500 \text{ kHz})+60=-87$ dBm.

In FIG. 3, the purpose of the power calibration is to establish the relationship between the setting of the programmable gain device 84 and the stimulus output at every frequency of interest. The calibration consists of two procedures, a programmable gain calibration and a frequency response calibration.

The programmable gain calibration establishes the relationship between the setting of the programmable gain device 84 and the power measured by the IF detector 78. In this calibration, the frequency F1 of the signal source 50 is set to some convenient value and the power measured by the IF detector is recorded for each setting of the programmable gain device 84. The relationship between the gain setting and the IF power is independent of the signal source frequency as long as the IF power is within the linear region of the IF detector 78. This calibration requires no external devices, and so may easily be repeated automatically to correct for the effects of thermal or other drift in the programmable gain device 84, the power detector 90, the error amplifier 98, the reference signal 94 and the loop integrator 102.

The frequency response calibration establishes the relationship between the power measured by the IF detector 7 and the power at the stimulus output at each frequency of measurement. It utilizes an absolute power measurement device (not shown) to record the power at the stimulus output at each frequency of interest for some convenient gain setting. This is adequate to establish the desired relationship, since the IF detector power at all gain settings is known from the programmable gain calibration. The measured frequency response value is independent of the gain setting as long as the frequency converter 64 and the LNA 68 are in their linear operating regions.

Since the programmable gain calibration establishes the relationship between the gain setting and the IF detector power independent of frequency, and the frequency response calibration establishes the relationship between the IF detector power and the stimulus output power independent of gain settings, these two calibrations together are adequate to establish the relationship between the gain setting and the stimulus output power at all gain settings and frequencies (with the restrictions previously noted).

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. For example, the present invention could be utilized with other types of test equipment, such as a voltmeter or a spectrum analyzers. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An adjustable gain power leveling detector wherein the leveling detector receives an output signal from a directional coupler, the leveling detector comprising:

first means for producing a signal whose amplitude is proportional to the amplitude of the output signal from the directional coupler and whose frequency is equal to a fixed intermodulation IF frequency, a power detector for providing a stable DC output voltage signal for an input of a single power at the IF frequency; and a leveling loop means for maintaining the power detector DC voltage signal substantially constant.

2. A leveling detector as in claim 1 wherein the leveling loop means includes a programmable gain device for providing a programmable gain calibration.

3. A leveling detector as in claim 2 wherein the leveling loop means includes a programmable gain device for providing a frequency response calibration.

4. A leveling detector as in claim 3 wherein the first means for producing includes a local oscillator and a frequency converter for producing the signal whose amplitude is proportional to the amplitude of the output signal from the directional coupler and whose frequency is equal to a fixed intermodulation IF frequency.

5. A leveling detector as in claim 4 including a low noise amplifier; a frequency splitter for providing two signals, a first signal and a second signal, each of which is proportional to the input signal; the low noise amplifier amplifying the IF frequency sufficiently to compensate for losses in the frequency splitter which injecting as little noise as possible.

6. A leveling detector as in claim 5 wherein the programmable gain device is a programmable gain amplifier for amplifying the first splitter signal by a programmable gain factor; and including a band pass filter for band pass filtering the amplified programmable gain amplifier signal; a narrow band power detector for providing a stable DC output voltage signal for an input of a single power at the IF frequency; and a low pass filter for removing residual IF signal from the DC output of the power detector.

7. A leveling detector as in claim 6 including a linear IF detector for linearly calibrating the second splitter signal over a wide range of signal levels; a power control algorithm for setting the gain to an appropriate level to give desired power at an RF output.

8. An adjustable gain power leveling detector wherein the leveling detector receives an output signal from a directional coupler, the leveling detector comprising:

a local oscillator and a frequency converter for producing a signal whose amplitude is proportional to the amplitude of the output signal from the directional coupler and whose frequency is equal to a fixed intermodulation IF frequency, a low noise amplifier;

a frequency splitter for providing two signals, a first signal and a second signal, each of which is proportional to the input signal;

the low noise amplifier amplifying the IF frequency sufficiently to compensate for losses in the frequency splitter which injecting as little noise as possible;

a programmable gain amplifier for amplifying the first splitter signal by a programmable gain factor;

a band pass filter for band pass filtering the amplified programmable gain amplifier signal;

a narrow band power detector for providing a stable DC output voltage signal for an input of a single power at the IF frequency;

a low pass filter for removing residual IF signal from the DC output of the power detector;

a linear IF detector for linearly calibrating the second splitter signal over a wide range of signal levels;

a power control algorithm for setting the gain to an appropriate level to give desired power at an RF output.

9. In an adjustable gain power leveling detector wherein the leveling detector receives an output signal from a directional coupler, the method comprising:

producing a signal whose amplitude is proportional to the amplitude of the output signal from the directional coupler and whose frequency is equal to a fixed intermodulation IF frequency, providing a stable DC output voltage signal for an input of a single power at the IF frequency; and maintaining the power detector DC voltage signal substantially constant.

10. The method as in claim 9 including providing a programmable gain calibration.

11. The method as in claim 10 including providing a frequency response calibration.

* * * * *